United States Patent
Miyanaga et al.

(10) Patent No.: US 10,598,843 B2
(45) Date of Patent: Mar. 24, 2020

(54) METHOD OF PRODUCING WAVELENGTH CONVERTING MEMBER

(71) Applicant: NS MATERIALS INC., Fukuoka (JP)

(72) Inventors: Akiharu Miyanaga, Fukuoka (JP); Eiichi Kanaumi, Fukuoka (JP); Shingo Kokudo, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 0 days.

(21) Appl. No.: 15/522,398

(22) PCT Filed: Oct. 27, 2015

(86) PCT No.: PCT/JP2015/080173
§ 371 (c)(1),
(2) Date: Apr. 27, 2017

(87) PCT Pub. No.: WO2016/072312
PCT Pub. Date: May 12, 2016

(65) Prior Publication Data
US 2017/0315287 A1 Nov. 2, 2017

(30) Foreign Application Priority Data
Nov. 4, 2014 (JP) .................................. 2014-224053

(51) Int. Cl.
*F21V 8/00* (2006.01)
*C09K 11/00* (2006.01)
(Continued)

(52) U.S. Cl.
CPC ............ *G02B 6/0023* (2013.01); *C09K 11/00* (2013.01); *C09K 11/02* (2013.01); *C09K 11/883* (2013.01);
(Continued)

(58) Field of Classification Search
CPC ............ G02B 6/0023; F21V 9/16; F21V 9/30; C09K 11/02; C09K 11/883; C09K 11/00;
(Continued)

(56) References Cited

U.S. PATENT DOCUMENTS 6,960,376 B2 * 11/2005 Tai ..................... A23L 3/3436
428/36.6
9,158,151 B2 * 10/2015 Ogata ............... G02F 1/133603
(Continued)

FOREIGN PATENT DOCUMENTS

EP          3217066        9/2017
JP       2009-71005        4/2009
(Continued)

OTHER PUBLICATIONS

Machine English Translation of JP 2013068728A Apr. 2013; Wada et al.*
(Continued)

*Primary Examiner* — Anh T Mai
*Assistant Examiner* — Glenn D Zimmerman
(74) *Attorney, Agent, or Firm* — Greenblum & Bernstein, P.L.C.

(57) ABSTRACT

To provide a wavelength converting member that allows for improved yield, in which air bubbles can be prevented from being left in a resin containing a wavelength converting material; a light emitting device, a light emitting element, a light source unit, a display device, and a light guide member using the wavelength converting member; and a method of producing the wavelength converting member. A wavelength converting member has a receptacle provided with a receiving space; and a molding containing a wavelength converting material, placed in the receiving space. This allows air bubbles from being left in the wavelength converting material and improves the yield.

1 Claim, 13 Drawing Sheets

(51) Int. Cl.
*F21S 2/00* (2016.01)
*H01L 33/50* (2010.01)
*F21V 9/30* (2018.01)
*C09K 11/02* (2006.01)
*C09K 11/88* (2006.01)
*F21Y 115/10* (2016.01)

(52) U.S. Cl.
CPC .............. *F21S 2/00* (2013.01); *F21V 9/30* (2018.02); *H01L 33/505* (2013.01); *F21Y 2115/10* (2016.08); *H01L 2933/0041* (2013.01)

(58) Field of Classification Search
CPC ...... F21Y 2115/10; F21S 2/00; H05K 999/99; H01L 33/50; H01L 33/00; H01L 33/505; H01L 2933/0041
USPC .......................................... 362/608, 611, 614
See application file for complete search history.

(56) References Cited

U.S. PATENT DOCUMENTS

| | | | | |
|---|---|---|---|---|
| 9,851,497 | B2* | 12/2017 | Sadasivan | G02B 6/009 |
| 2002/0015309 | A1* | 2/2002 | Stokes | A62B 3/00 362/471 |
| 2003/0127660 | A1* | 7/2003 | Bawendi | B82Y 10/00 257/89 |
| 2007/0097664 | A1* | 5/2007 | Stokes | G09F 13/22 362/84 |
| 2008/0253139 | A1* | 10/2008 | Stokes | A62B 3/00 362/471 |
| 2010/0033951 | A1* | 2/2010 | Luginbuhl | H01H 9/185 362/95 |
| 2012/0001538 | A1* | 1/2012 | Kim | H01L 25/0753 313/512 |
| 2012/0075837 | A1 | 3/2012 | Um | |
| 2012/0257414 | A1* | 10/2012 | Park | G02B 6/0068 362/611 |
| 2013/0189803 | A1* | 7/2013 | Nasaani | C09K 11/02 438/27 |
| 2014/0029299 | A1* | 1/2014 | Hyun | G02F 1/133615 362/611 |
| 2014/0133159 | A1* | 5/2014 | Asano | C03B 23/245 362/317 |
| 2014/0240644 | A1 | 8/2014 | Abe | |
| 2014/0293617 | A1* | 10/2014 | O'Kell | A62B 3/00 362/317 |
| 2015/0077970 | A1* | 3/2015 | Cha | F21K 9/56 362/84 |
| 2015/0159833 | A1* | 6/2015 | Qiu | G02B 3/00 362/335 |
| 2017/0222095 | A1* | 8/2017 | Yamashita | H01L 33/507 |
| 2017/0269280 | A1* | 9/2017 | Kokudo | G02B 6/0026 |
| 2017/0352789 | A1* | 12/2017 | Miyanaga | H01L 33/508 |

FOREIGN PATENT DOCUMENTS

| | | | | |
|---|---|---|---|---|
| JP | 2012-73613 | | 4/2012 | |
| JP | 2013-16583 | | 1/2013 | |
| JP | 2013-68728 | | 4/2013 | |
| JP | 2013-115351 | | 6/2013 | |
| JP | 2013-218954 | | 10/2013 | |
| JP | 2014-165116 | | 9/2014 | |
| JP | 2018128694 A | * | 8/2018 | ............ C09K 11/02 |
| WO | 2013/108125 | | 7/2013 | |

OTHER PUBLICATIONS

Wikipedia Article—Interference Fit (Year: 2019).*
Machine English Translation (Google) of JP2018128694A; Yamashita et al. (Year: 2018).*
International Search Report, along with English-language translation thereof, issue in PCT/JP2015/080173 dated Dec. 22, 2015.
European Search Report dated Jul. 25, 2018 for European Application No. 15 85 7683.5-1211.

* cited by examiner

METHOD OF PRODUCING WAVELENGTH CONVERTING MEMBER

TECHNICAL FIELD

The present invention relates to a wavelength converting member in which a molding formed from a wavelength converting material is placed in a receptacle; a light emitting device, a light emitting element, a light source unit, a display device, and a light guide member using the wavelength converting member, and a method of producing the wavelength converting member.

BACKGROUND ART

For example, JP 2013-218954 A (PTL 1) below discloses an invention relating to a light emitting device including a light source, a wavelength converting member, a light guide plate, and others.

The wavelength converting member is provided between the light source and the light guide plate, and absorbs light emitted from the light source and then produces light having a different wavelength from the light from the light source. The wavelength converting member described in PTL 1 includes a wavelength converting material encapsulated in a cylindrical receptacle made of glass or the like. Fluorescent pigment, fluorescent dye, and quantum dots are given as the wavelength converting material.

CITATION LIST

Patent Literature

PTL 1: JP 2013-218954 A

SUMMARY OF INVENTION

Technical Problem

However, any wavelength converting member formed by filling a cylindrical receptacle made of glass or the like with a resin containing a wavelength converting material such as fluorescent pigment, for example, has not been disclosed to date. As a method of filling a cylindrical receptacle with a resin containing a wavelength converting material, a receptacle may be filled with a liquid resin mixed with a wavelength converting material. However, it is difficult to fill a long and narrow cylindrical receptacle with a liquid resin without leaving gaps (voids), likely leading to defects; for example, air bubbles would be mixed in, or non-uniformity would arise due to shrinkage caused by curing of the resin. Further, since it is also difficult to control the rate, pressure, and the like when filling the receptacle with the liquid without leaving air bubbles, the yield would likely be reduced.

The present invention was made in consideration of the above, in particular with a view to providing a wavelength converting member that allows for improved yield, in which air bubbles can be prevented from being left in a resin containing a wavelength converting material; a light emitting device, a light emitting element, a light source unit, a display device, and a light guide member using the wavelength converting member; and a method of producing the wavelength converting member.

Solution to Problem

A wavelength converting member of the present invention includes: a receptacle provided with a receiving space; and a molding containing a wavelength converting material, placed in the receiving space.

When a molding containing a wavelength converting material is placed in a receiving space as described above, air bubbles can be prevented from being mixed in and the yield can be improved compared to a structure in which a liquid resin is injected into a receiving space. Further, forming a molding containing a wavelength converting material facilitates quality control.

In the present invention, the molding containing the wavelength converting material is preferably obtained by molding a resin composition in which quantum dots are dispersed.

In the present invention, the receptacle is provided with a light entrance plane, a light exit plane facing the light entrance plane, and side surfaces connecting the light entrance plane and the light exit plane; the receiving space is provided inside the side surfaces; and colored layers are preferably formed on the side surfaces, on end portions of the light exit plane, or over the side surfaces and the end portions of the light exit plane.

Alternatively, in the present invention, the receptacle is provided with a light entrance plane, a light exit plane facing the light entrance plane, and side surfaces connecting the light entrance plane and the light exit plane; the receiving space is provided inside the side surfaces; and colored layers may be formed on wall surfaces defining the receiving space. Yet alternatively, in the present invention, the receptacle is provided with a light entrance plane, a light exit plane facing the light entrance plane, and side surfaces connecting the light entrance plane and the light exit plane; the receiving space is provided inside the side surfaces; and colored layers may be formed to fit between the side surfaces of the receptacle and the receiving space.

In the present invention, the receptacle is provided with a light entrance plane, a light exit plane facing the light entrance plane, and side surfaces connecting the light entrance plane and the light exit plane; the receiving space is provided inside the light entrance plane and the light exit plane; and a distance L1 between the light entrance plane and the receiving space is preferably longer than a distance L2 between the light exit plane and the receiving space.

A light emitting device of the present invention is configured to have a light emitting element and any one of the above wavelength converting members, placed on the light emission side of the light emitting element.

A light emitting element of the present invention is configured to have a light emitting chip and any one of the above wavelength converting members, placed on the light output side of the light emitting chip.

A light source unit of the present invention includes: either the above light emitting device or the above light emitting element; and a light guide plate.

In a light guide member of the present invention, the above wavelength converting member is integrated with a light guide plate.

A light source unit of the present invention includes the above light guide member and a light emitting element, the light emitting element being attached to the light entrance plane of the light guide member.

Further, a display device of the present invention includes: a display area; and one of the above light emitting device, the above light emitting element, the above light source unit, the above light guide member, and the above light source unit, placed on the back side of the display area.

A method of producing a wavelength converting member of the present invention includes the steps of: forming a molding containing a wavelength converting material; and inserting the molding into a receiving space provided in a receptacle. Thus, the molding containing the wavelength converting material is previously formed to be inserted into the container receptacle, which can prevent air bubbles from being mixed in. This improves workability and yield while facilitating quality control. Further, unlike in a method in which a liquid resin is injected, since the easy method of inserting the molding containing the wavelength converting material into the container receptacle is used, the wavelength converting member can easily be formed with no need for complicated control of the rate and pressure for the filling (injection).

Advantageous Effects of Invention

According to the present invention, a molding containing a wavelength converting material is placed in a receiving space as described above, which prevents air bubbles from being left in the wavelength converting material and improves the yield compared to a structure in which a liquid resin is injected into a receiving space. Further, forming the molding containing the wavelength converting material facilitates quality control.

BRIEF DESCRIPTION OF DRAWINGS

In the accompanying drawings.

DESCRIPTION OF EMBODIMENTS

Embodiments of the present invention (hereinafter simply referred to as "embodiments") will now be described in detail. The present invention is not limited to the following embodiments and can be variously altered without departing from the spirit of the present invention.

Figure 1A:
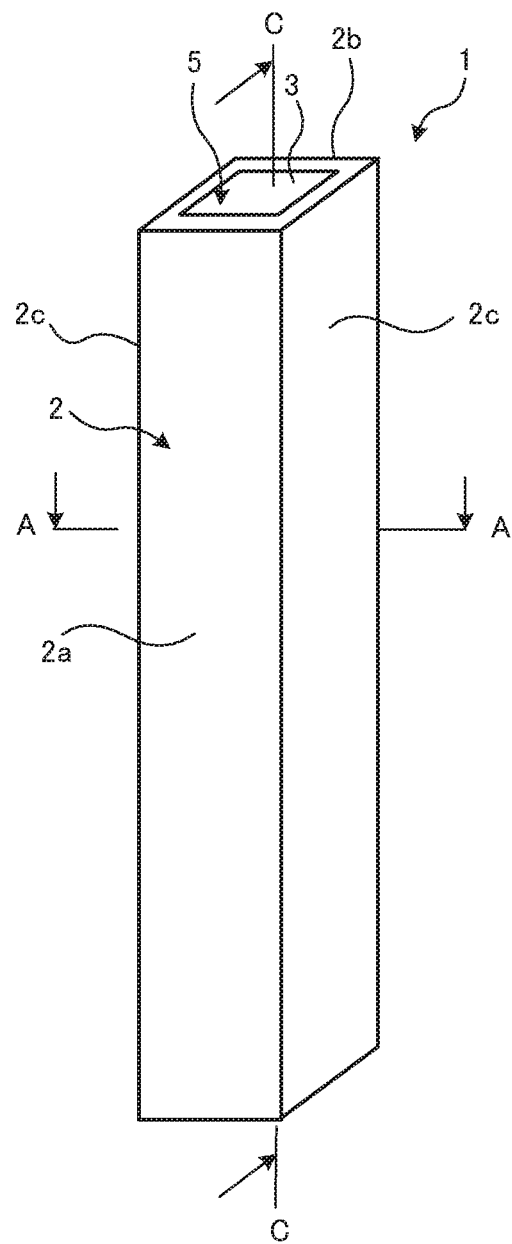
FIGS. 1A and 1B show a perspective view and a cross-sectional view, respectively, of a wavelength converting member exemplifying a first embodiment of the embodiments.
Figure 1B:
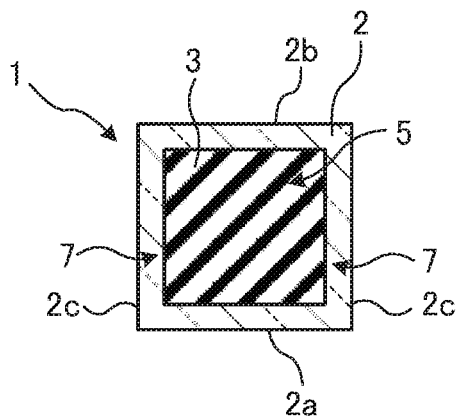

FIGS. 1A and 1B show a perspective view and a cross-sectional view of a wavelength converting member exemplifying a first embodiment of the embodiments.

FIG. 1A is a perspective view of the wavelength converting member of the first embodiment. FIG. 1B is a cross-sectional view of the wavelength converting member shown in FIG. 1A, taken transversely along line A-A and viewed in the direction of the arrows.

As shown in FIG. 1A, a wavelength converting member 1 of the first embodiment is configured to have a receptacle 2 and a molding 3 containing a wavelength converting material.

The receptacle 2 includes a receiving space 5 in which the molding 3 containing the wavelength converting material can be received and held. The receptacle 2 is preferably a transparent member. "Transparent" herein refers to being commonly recognized as transparent or having a visible light transmittance of approximately 50% or more.

For example, the length and width of the receptacle 2 are approximately several millimeters to several tens of millimeters, whereas the length and width of the receiving space 5 are approximately several hundreds of micrometers to several millimeters.

As shown in FIGS. 1A and 1B, the receptacle 2 includes a light entrance plane 2a, a light exit plane 2b, and side surfaces 2c connecting the light entrance plane 2a and the light exit plane 2b. As shown in FIGS. 1A and 1B, the light entrance plane 2a and the light exit plane 2b are positioned to face each other.

As shown in FIGS. 1A and 1B, in the receptacle 2, the receiving space 5 is formed inside the light entrance plane 2a, the light exit plane 2b, and the side surfaces 2c. Note that part of the receiving space 5 may reach the light entrance plane 2a, the light exit plane 2b, or the side surfaces 2c.

As shown in FIG. 1B, in the cross section taken along a plane perpendicular to at least one of the light entrance plane 2a and the light exit plane 2b, both the outline of the receiving space 5 and the outline of the receptacle 2 have a rectangular shape. Such a cross section shows a plane along which the wavelength converting member is cut in a direction such that the light entrance plane 2a, the light exit plane 2b, and the side surfaces 2c can be seen. Here, the "rectangular shape" includes squares and oblongs with approximately right angles at the four vertices.

As shown in FIG. 1B, the cross-sectional contour of the receiving space 5 and the cross-sectional contour of the receptacle 2 are preferably similar to each other.

The receptacle 2 shown in FIGS. 1A and 1B is, for example, a glass tube receptacle, and a glass capillary can be given as an example. Alternatively, the receptacle may be made of a resin or the like as long as the receptacle has excellent transparency as described above.

As shown in FIGS. 1A and 1B, the molding 3 containing the wavelength converting material is placed in the receiving space 5. As shown in FIGS. 1A and 1B, the receiving space 5 is open, and the molding 3 containing the wavelength converting material can be inserted through the opening.

The wavelength converting material according to this embodiment constitutes a molding. The molding 3 containing the wavelength converting material is previously worked by molding to fit to the shape of the receiving space 5. Further, inserting the molding 3 containing the wavelength converting material into the receiving space 5 of the receptacle 2 allows the molding 3 containing the wavelength converting material to be suitably placed in the receiving space 5. This can prevent air bubbles from being left in the wavelength converting material or prevent non-uniformity of the wavelength converting material, compared to the case where the wavelength converting material is injected into the receiving space 5 to fill the receiving space 5. In other words, the wavelength converting material can be uniformly distributed. For example, when air bubbles are left, light diffusion or the like at the areas would reduce the wavelength conversion efficiency. Therefore, this embodiment in which air bubbles can be prevented from being left in the wavelength converting material can effectively improve the wavelength conversion efficiency. Further, in this embodiment, since air bubbles can be prevented from being left in the wavelength converting material, the yield can be improved and quality control can be facilitated.

The molding 3 containing the wavelength converting material is inserted into the receiving space 5 by means of press fit, bonding, or the like. When press fit is employed, the molding 3 containing the wavelength converting material is molded to be exactly as large as the receiving space 5 or to be slightly larger than the receiving space 5, and the molding 3 containing the wavelength converting material is inserted into the receiving space 5 with pressure being applied; thus, gaps (voids) can be prevented from being formed not only inside the molding 3 containing the wavelength converting material but also between the receptacle 2 and the molding 3 containing the wavelength converting material.

When the molding 3 containing the wavelength converting material is fixed in the receiving space 5 by bonding, the molding 3 containing the wavelength converting material is molded to be smaller than the receiving space 5, and the molding 3 containing the wavelength converting material is inserted into the receiving space 5 with an adhesive layer being applied to side surfaces of the molding 3 containing the wavelength converting material. In this case, the cross-sectional area of the molding 3 may be slightly smaller than that of the receiving space 5. This allows the molding 3 containing the wavelength converting material and the receptacle 2 to be in close contact with the adhesive layer therebetween, and can prevent gaps from being formed between the molding 3 containing the wavelength converting material and the receptacle 2. For the adhesive layer, the same resin as the molding 3, or a resin having the same basic structure as the resin can be used. Alternatively, a transparent adhesive member may be used as the adhesive layer.

The molding 3 containing the wavelength converting material shown in FIGS. 1A and 1B preferably contains a material which absorbs blue light and emits red light, and a material which absorbs blue light and emits green light. Specifically, the molding 3 containing the wavelength converting material preferably contains quantum dots. Fluorescent pigment, fluorescence dye or the like other than quantum dots may be used for the molding 3 containing the wavelength converting material; however, excellent wavelength conversion characteristics can be obtained when using quantum dots.

The molding 3 containing the wavelength converting material is preferably obtained by molding a resin composition in which quantum dots are dispersed. Examples of resins that can be used include: polypropylene, polyethylene, polystyrene, AS resin, ABS resin, methacrylate resin, polyvinyl chloride, polyacetal, polyamide, polycarbonate, modified polyphenylene ether, polybutylene terephthalate, polyethylene terephthalate, polysulfone, polyethersulfone, polyphenylene sulfide, polyamide-imide, polymethylpentene, liquid crystal polymers, epoxy resin, phenol resin, urea formaldehyde resin, melamine resin, epoxy resin, diallyl phthalate resin, unsaturated polyester resin, polyimide, polyurethane, silicone resin, and mixtures thereof. Of those, a silicone resin or an epoxy resin is preferably used to form a resin composition in which the quantum dots are dispersed. More preferably, a silicone resin is used to form a resin composition in which the quantum dots are dispersed.

Further, the refractive index of the molding 3 containing the wavelength converting material is preferably lower than the refractive index of the receptacle 2. The refractive index of the sodium D line through a silicone resin composition at 23° C. is for example, 1.52 for SCR1016 manufactured by Shin-Etsu Chemical Co., Ltd.; 1.55 for A2045 manufactured by Daicel Corporation; 1.41 for KER-2500 manufactured by Shin-Etsu Chemical Co., Ltd.; and 1.41 for A1080 manufactured by Daicel Corporation. Meanwhile, the refractive index of the sodium D line through an epoxy resin composition at 23° C. is 1.51 and 1.50 for CELVENUS WO917 and CELVENUS WO925 both manufactured by Daicel Corporation, respectively. On the other hand, the receptacle 2 made of glass has a refractive index of nearly 1.45 when made of typical glass, and approximately 1.50 to 1.90 when made of highly refractive optical glass. Accordingly, when the resin forming the molding 3 containing the wavelength converting material and the material of the receptacle 2 are suitably selected, the refractive index of the resin forming the molding 3 containing the wavelength converting material can be made lower than the refractive index of the receptacle 2. For example, a silicone resin A1080 or KER-2500 having a refractive index of 1.41 can be used for the molding 3 containing the wavelength converting material, whereas the receptacle 2 can be made of glass having a refractive index of 1.45. In another example, a silicone resin or an epoxy resin having a refractive index of 1.41 to 1.55 can be used for the molding 3 containing the wavelength converting material and the receptacle 2 can be made of glass having a high refractive index of 1.56 or more. This causes part of light having entered the molding 3 containing the wavelength converting material to be totally reflected at side wall portions of the receptacle 2 facing the receiving space 5, because the angle of incidence is larger on the low refractive index medium side than on the angle of incidence on the high refractive index medium side. Thus, the amount of light leaking from the sides of the receptacle 2 can be reduced, thereby increasing color conversion efficiency and light emission intensity. It should be noted that the resin composition forming the molding 3 containing the wavelength converting material is not limited to a resin used to contain dispersed quantum dots.

Although the structure and the material of the quantum dots contained in the molding 3 containing the wavelength converting material are not limited; for example, a quantum dot in this embodiment can have a core consisting of a semiconductor particle and a shell part coating the circumference of the core. A material that is used for the core is, for example, but not limited to CdSe. For example, a core material containing at least Zn and Cd; a core material containing Zn, Cd, Se, and S; ZnCuInS; CdS; CdSe; ZnS; ZnSe; InP; CdTe; or a composite thereof can be used. A quantum dot of this embodiment may be configured to have only a core part consisting of a semiconductor particle without the formation of a shell part. Accordingly, the quantum dot does not necessarily have a coating structure using a shell part as long as they have at least a core part. For example, when a core part is coated with a shell part, there are cases where the coating structure cannot be analyzed or observed because the area of the coating structure is too small or the coating part is too thin. Therefore, a quantum dot can be identified regardless of whether or not the presence of a shell part is determined by analysis.

The quantum dots include, for example, two types of quantum dots having an absorption (excitation) wavelength of 460 nm (blue): those which have a fluorescence wavelength of approximately 520 nm (green) and those which have a fluorescence wavelength of approximately 660 nm (red). Accordingly, when blue light enters the light entrance plane $2a$, each quantum dot converts part of the blue light into green or red light. Thus, white light can be obtained from the light exit plane $2b$.

Figure 2A:
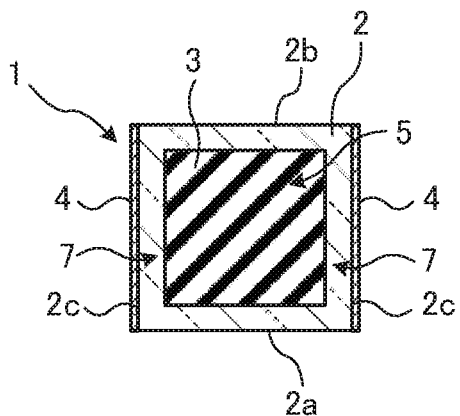
FIGS. 2A to 2C are cross-sectional views each showing a wavelength converting member provided with colored layers.
Figure 2B:
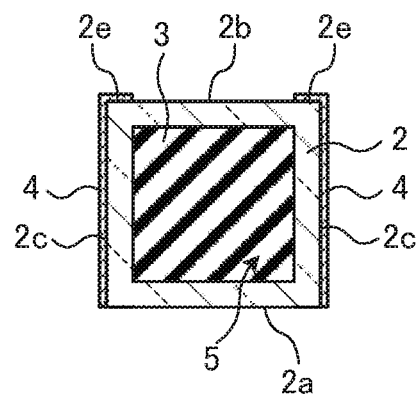
Figure 2C:
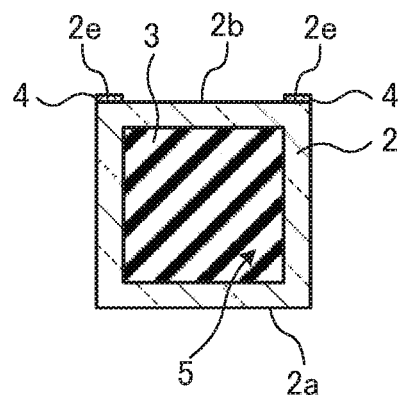

FIGS. 2A to 2C are cross-sectional views each showing a wavelength converting member provided with colored layers. In this embodiment, as shown in FIG. 2A, side surfaces $2c$, $2c$ may be provided with colored layers 4, 4. The term "colored layer" refers to a non-transparent layer that is colored in any color including white. The colored layers 4 are preferably made of paint, ink, or tape. The color of the colored layers 4 is preferably, but not limited to, white. Accordingly, the color layers 4 can simply be formed by coating the side surfaces $2c$ with white paint or white ink or by sticking white tape to the side surfaces $2c$.

Providing the colored layers 4 in this manner can prevent light leak, where light exits through side areas 7, compared to the prior art, enable suitable and efficient color conversion, and provide light having a desired color from the light exit plane $2b$. According to this embodiment, the light emission intensity of white light can be made as high as or higher than in the prior art. Alternatively, a metal such as Ni, Ag, Al, or Cr can be vapor deposited to form the colored layers 4.

In FIG. 2A, the colored layers 4 are formed on the side surfaces $2c$ of the receptacle 2; alternatively, as shown in FIG. 2B, the colored layers 4 can be formed over the side surfaces $2c$ of the receptacle 2 and end portions $2e$ of the light exit plane $2b$. Yet alternatively, as shown in FIG. 2C, the colored layers 4 can be formed only on the end portions $2e$ of the light exit plane $2b$. Note that the colored layers 4 are preferably formed on the side surfaces $2c$ of the receptacle 2 as shown in FIG. 2A or over the side surfaces $2c$ of the receptacle 2 and the end portions $2e$ of the light exit plane $2b$ as shown in FIG. 2B.

The end portions $2e$ of the light exit plane $2b$ face the side areas 7 between the receiving space 5 and the side surfaces $2c$. Accordingly, the end portions $2e$ do not face the receiving space 5 in which the molding 3 containing the wavelength converting material is placed. It is preferable that the colored layers 4 provided on the end portions $2e$ of the light exit plane $2b$ are located on each side of the receiving space 5 in which the molding 3 containing the wavelength converting material is placed, and do not face the receiving space 5; however, the colored layers 4 may be formed to somewhat extend on the light exit plane $2b$ and partly face the receiving space 5. For example, it is acceptable if the colored layers 4 face approximately ⅓ or less of the width of the receiving space 5.

The colored layers 4 are preferably, but not necessarily, formed all over the side surfaces $2c$ or the end portions $2e$, and the colored layers 4 may be formed on part of the side surfaces $2c$ or the end portions $2e$. Note that the colored layers 4 preferably cover 50% or more of the area of the side surfaces $2c$ or the end portions $2e$. Instead of forming the colored layers 4 on the side areas 7, the whole or part of the side areas 7 can be formed from a colored material. For example, the whole or part of the side areas 7 can be formed from white glass or white resin.

Figure 3A:
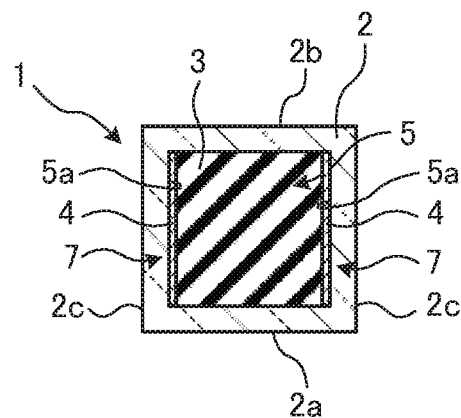
FIGS. 3A to 3C are cross-sectional views each showing a wavelength converting member having a different cross-sectional shape from the ones in FIGS. 2A to 2C.

In the above example, the colored layers 4 are formed on the external surfaces of the receptacle 2; alternatively, the colored layers 4 can be formed on wall surfaces $5a$ defining the receiving space 5 as shown in FIG. 3A. The wall surfaces $5a$ forming the colored layers 4 are positioned to face the side surfaces $2c$ of the receptacle 2.

Figure 3B:
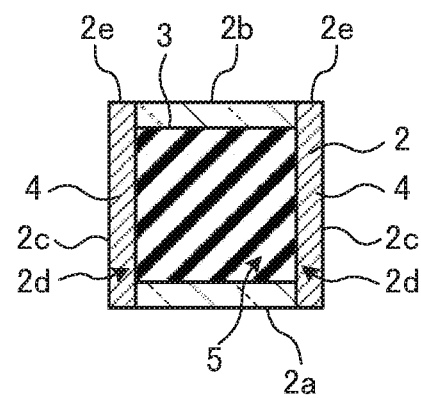

Alternatively, as shown in FIG. 3B, side portions $2d$ of the receptacle 2 between the side surfaces $2c$ of the receptacle 2 and the receiving space 5 themselves can constitute the colored layers 4. In that case, the receptacle 2 is formed by double injection molding, in which case, a colored resin is used for parts to be the side portions $2d$ of the receptacle 2. Alternatively, the side portions $2d$ of the receptacle 2 can be joined to the other components, for example, by bonding to obtain the receptacle 2 shown in FIG. 3B. Here, in FIG. 3A and FIG. 3B, the same reference numerals as in FIG. 2A and FIG. 2B indicate like parts in FIG. 2A and FIG. 2B.

Figure 3C:
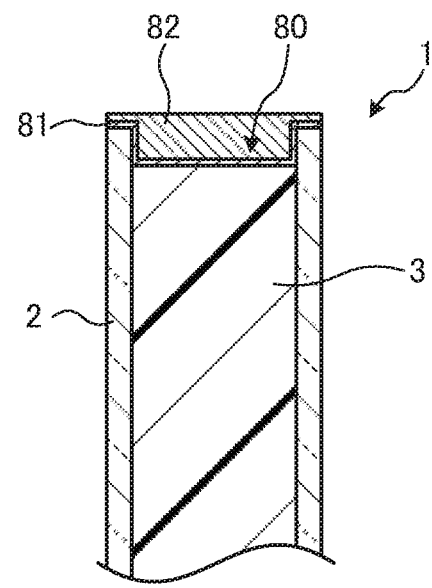

FIG. 3C is a cross-sectional view of the wavelength converting member 1 shown in FIG. 1A, taken along line C-C and viewed in the direction of the arrows. As shown in FIG. 3C, stepped portions 80 are formed at both ends of the wavelength converting member 1, such that the molding 3 recedes from the top of the receptacle 2. A chip 82 serving as a colored layer covering the stepped portions 80 is connected to the molding 3 with an adhesive layer 81 provided therebetween. The chip 82 is formed into an approximately inverted shape of the stepped portions 80, such that part of the chip 82 facing the molding 3 protrudes. The chip 82 is made of, for example, Al; however, the material is not specifically limited. The adhesive layer 81 preferably has water barrier properties. Note that colored layers may be formed over both ends of the wavelength converting member 1 without the formation of the stepped portions 80. This can suppress light leak from the ends of the wavelength converting member 1, leading to suitable and highly efficient color conversion compared to the prior art.

Figure 4:
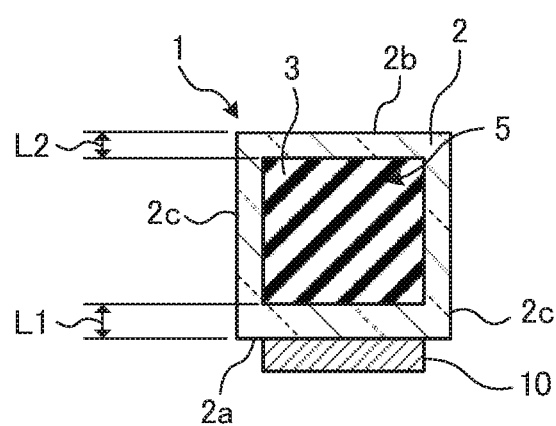
FIG. 4 is a cross-sectional view of a wavelength converting member in which the wall of a receptacle is thicker on the light entrance plane side when viewed from a receiving space (a molding containing a wavelength converting material)

FIG. 4 is a cross-sectional view of a wavelength converting member in which the wall of a receptacle is thicker on the light entrance plane side when viewed from a receiving space (a molding containing a wavelength converting material).

As shown in FIG. 4, the distance between the light entrance plane $2a$ and the molding 3 containing the wavelength converting material is L1, whereas the distance between the light exit plane $2b$ and the molding 3 is L2. The distances L1 and L2 are straight-line distances. For example, a straight line is drawn between the centers of the light entrance plane $2a$ and the light exit plane $2b$, and the distances L1 and L2 can be measured as lengths along the straight line.

As shown in FIG. 4, in this embodiment, the distance L1 is longer than the distance L2. In other words, the wall of the receptacle 2 is thicker on the light entrance plane $2a$ side than on the light exit plane 2b side when viewed from the molding 3 containing the wavelength converting material.

For example, the distance L1 is, but not limited to, approximately 1 mm to 8 mm, whereas the distance L2 is, but not limited to, approximately 0.2 mm to 1 mm. By way of example, the distance L1 is approximately 5 mm, and the distance L2 is approximately 0.5 mm.

In this embodiment, as shown in FIG. 4, a light emitting element (light source) 10, for example, LEDs can be attached to the light entrance plane 2a of the wavelength converting member 1. The light emitting element 10 abuts the light entrance plane 2a of the wavelength converting member 1.

In FIG. 4, the molding 3 containing the wavelength converting material, formed in the wavelength converting member 1 is placed closer to the light entrance plane 2a than to the light exit plane 2b. As a result, compared to the case where as shown in FIG. 1B, when the molding 3 containing the wavelength converting material is placed in the middle between the light entrance plane 2a and the light exit plane 2b and the light emitting element 10 abuts the light entrance plane 2a like in FIG. 4, the molding 3 containing the light converting material can be placed farther from the light emitting element 10 in the structure of FIG. 4 compared to the structure of FIG. 1B. In FIG. 4, the wavelength converting member 1 is placed in contact with the light emitting element 10, so that the wavelength converting member 1 and the light emitting element 10 can be integrated with the molding 3 containing the wavelength converting material being kept at a distance from the light emitting element 10.

It has been found that when the molding 3 containing the wavelength converting material is adjacent to the light emitting element 10, blackening occurs in part of the molding 3 containing the wavelength converting material, facing the light emitting element 10. The blackening seems to occur because light or heat or both from the light emitting element 10 affect the quantum dots.

To address this problem, in the structure of FIG. 4, the distance L1 between the molding 3 containing the wavelength converting material and the light entrance plane 2a is made longer than the distance L2 between the molding 3 containing the wavelength converting material and the light exit plane 2b to keep the molding 3 containing the wavelength converting material at a distance from the light emitting element 10 thereby suppressing the occurrence of blackening. This allows the molding 3 containing the wavelength converting material to be suitably kept at a distance from the light emitting element 10 even when the wavelength converting member 1 is placed in contact with the light emitting element 10 as shown in FIG. 4. Thus, the occurrence of blackening can be suppressed compared to the prior art.

In this embodiment, the wall of the receptacle 2 is thinner on the light exit plane 2b side when viewed from the molding 3 containing the wavelength converting material. This can suppress the occurrence of blackening while preventing the increase in the general thickness of the whole receptacle 2 (the width between the light entrance plane 2a and the light exit plane 2b).

Figure 5A:
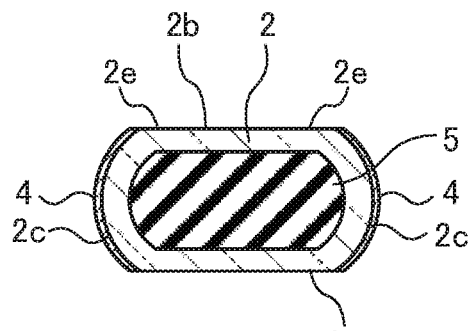
FIGS. 5A to 5D are cross-sectional views each showing a wavelength converting member having a different cross-sectional shape from the ones in FIGS. 2A to 2C.

As shown in FIG. 1B and FIGS. 2A to 2C, the outer shape of the cross-sectional shape of the receptacle 2 and the receiving space 5 is preferably rectangular. Note, however, that the side surfaces 2c of the receptacle 2 and the side wall surfaces defining the receiving space 5 may have curved surfaces or constitute part of an oval-like shape as shown in FIG. 5A. FIGS. 5A to 5D are cross-sectional views each showing a wavelength converting member having a different cross-sectional shape from the ones in FIGS. 2A to 2C.

Figure 5B:
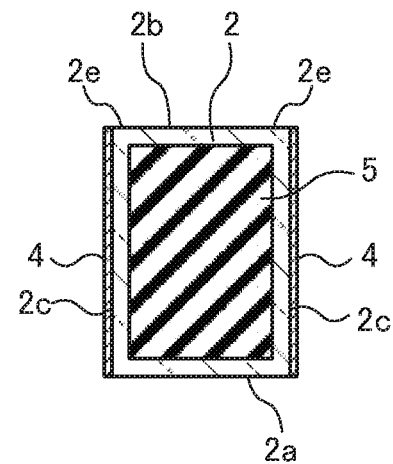

In FIG. 1B and FIGS. 2A to 2C, the outer shape of the receptacle 2 and the receiving space 5 is square; alternatively, the outer shape of the receptacle 2 and the receiving space 5 can be oblong as shown in FIG. 5B.

It should be noted that the provision of the colored layers 4 results in favorable effects (color conversion can be performed suitably and highly efficiently, and light of a more desirable color can be obtained compared to the prior art), and the distance L1 between the light entrance plane 2a and the molding 3 containing the wavelength converting material can be more suitably and easily made longer than the distance L2 between the light exit plane 2b and the molding 3 containing the wavelength converting material as shown in FIG. 4 when the cross-sectional shapes are rectangular as shown in FIG. 1B, FIGS. 2A to 2C, FIG. 4, and FIG. 5B than when the cross-sectional shapes have curved lines.

Figure 5C:
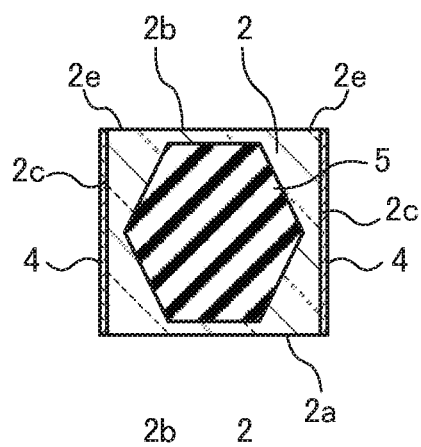
Figure 5D:
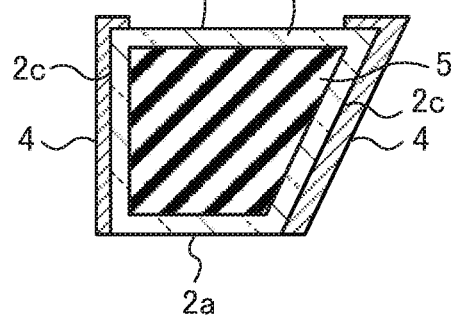

The outlines of the cross sections of the receptacle 2 and the receiving space 5 are similar to each other in FIG. 1B, FIGS. 2A to 2C, FIG. 4, and FIGS. 5A and 5B; alternatively, the outline of the cross section of the receptacle 2 may be different from the outline of the cross section of the receiving space 5 as shown in FIG. 5C. For example, in FIG. 5C, the outline of the cross section of the receptacle 2 is rectangular, whereas the outline of the cross section of the receiving space 5 is hexagonal. As shown in FIG. 5D, the outlines of the cross sections of the receptacle 2 and the receiving space 5 can have trapezoidal shapes similar to each other. For example, in FIG. 5D, the short side of the trapezoid corresponds to the light entrance plane 2a, and the long side thereof corresponds to the light exit plane 2b. This structure makes it possible to expand light emitted from a light source to a predetermined degree. In another example, in contrast to FIG. 5D, the long side of the trapezoid may correspond to the light entrance plane 2a, and the short side thereof may correspond to the light exit plane 2b. This structure makes it possible to focus light emitted from a light source to a predetermined degree. Alternatively, in the outlines of the cross sections of the receptacle 2 and the receiving space 5, the sides of the trapezoid are mutually line symmetric with respect to a center line passing through the centers of the upper base and the lower base of the trapezoid, unlike in FIG. 5D.

In each of FIGS. 5A to 5D, the colored layers 4 are provided; however, the colored layers 4 are not necessarily formed. Further, as shown in FIG. 4, the wall of the receptacle may be thicker on the light entrance plane 2a side when viewed from the molding 3 containing the wavelength converting material.

The light entrance plane and the light exit plane are formed to be flat in each of FIG. 1B, FIGS. 2A to 2C, and FIG. 5A to 5D; alternatively, either or both of the light entrance plane and the light exit plane may be formed to be curved. The side surfaces of the receptacle 2 are formed to be flat in each of FIG. 1B, FIGS. 2A to 2C, FIG. 4D, and FIGS. 5B to 5D; alternatively, the side surfaces may be formed to be curved. Further, the angles between the sides may be rounded. Specifically, expressions such as rectangular shapes, hexagonal shapes, and trapezoidal shapes are not limited to geometrically precise rectangles, hexagons, and trapezoids; and lines and angles forming those shapes may have distortions or deviations. Thus, the direction of the emission of light can be adjusted.

Figure 6:
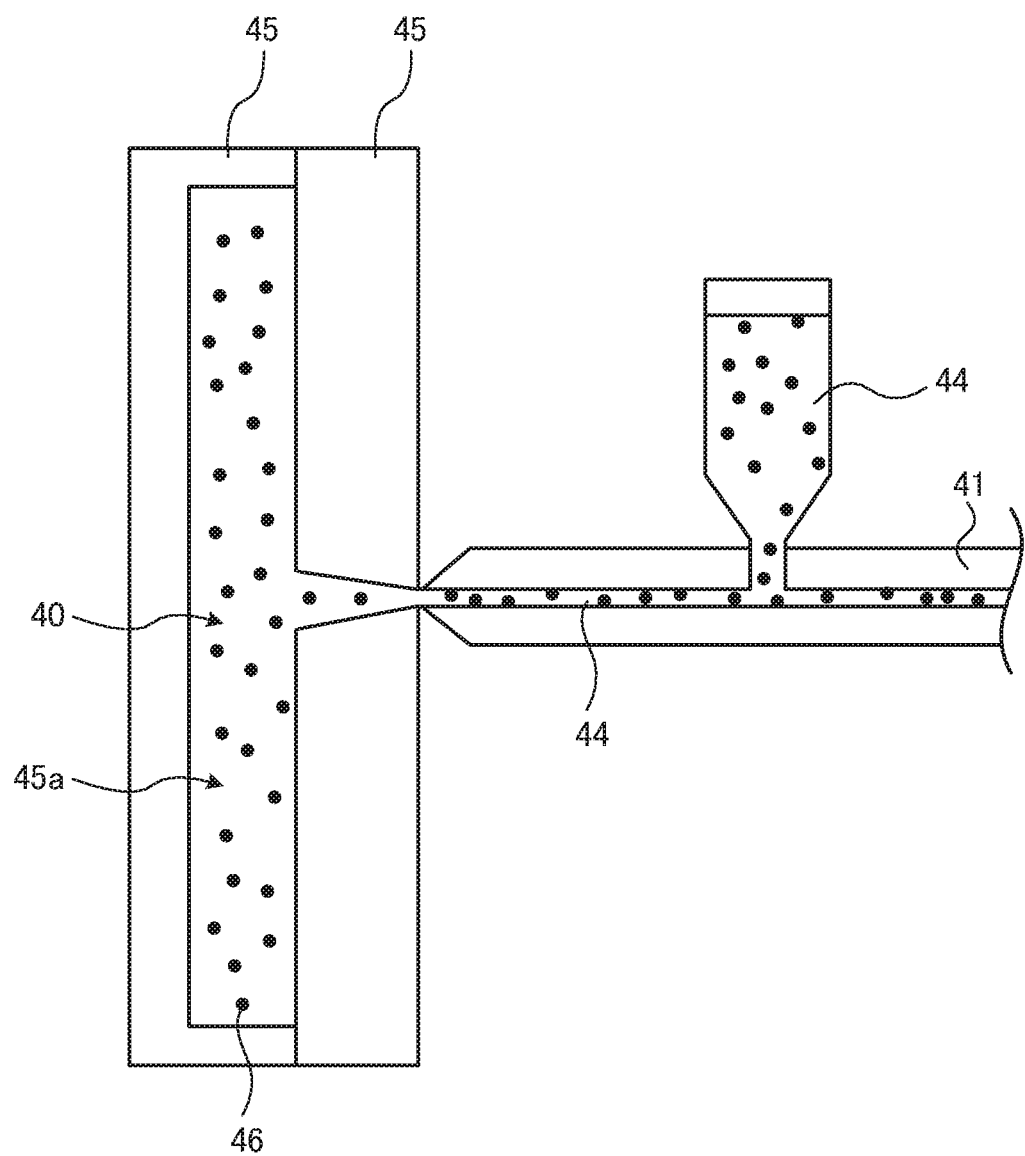
FIG. 6 is a view illustrating a process for molding a molding containing a wavelength converting material according to the embodiments.
Figure 7:
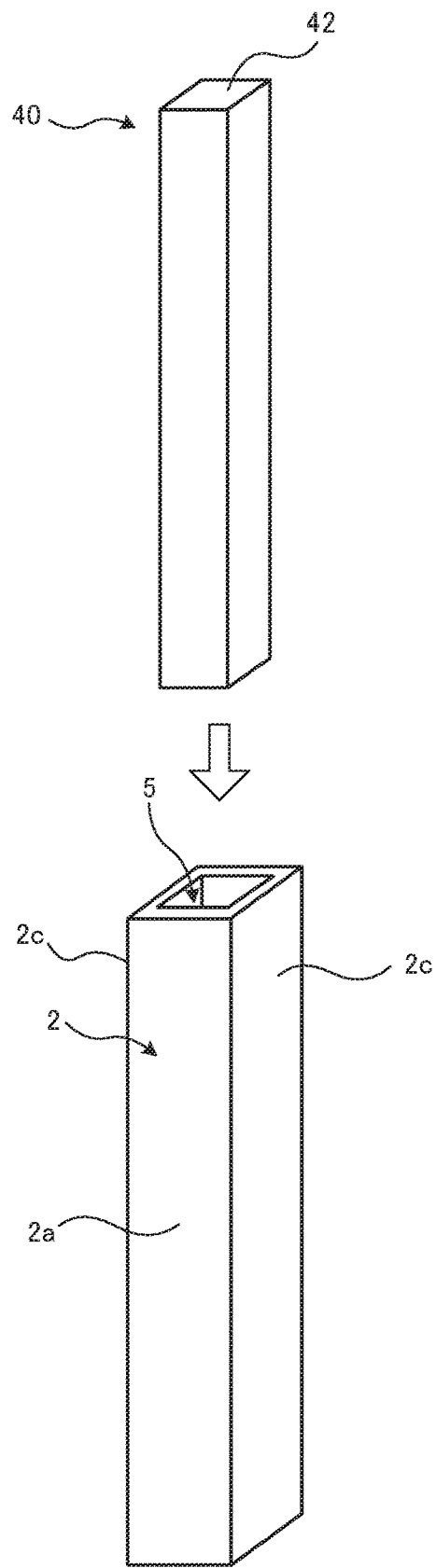
FIG. 7 is a view illustrating a process for inserting the molding containing the wavelength converting material shown in FIG. 6 into a receiving space.

Next, the wavelength converting member 1 according to this embodiment will be described. FIG. 6 is a view illustrating a process for molding a molding containing a wavelength converting material according to this embodiment. FIG. 7 is a view illustrating a process for inserting the molding containing the wavelength converting material shown in FIG. 6 into a receiving space.

As shown in FIG. 6, metal molds 45 and an injection molding machine 41 are prepared. Here, the shape of a mold cavity 45a of the metal molds 45 is approximately the same as the shape of the receiving space 5 of the receptacle 2. The term "approximately the same" applies not only to the case where the shapes are exactly the same but may also apply to the case where they are slightly different in size. Specifically, a size difference of approximately 5% is acceptable.

In FIG. 6, since the molding 3 containing the wavelength converting material shown in FIG. 1A is molded, the molding cavity 45a of the metal molds 45 is shaped like a thin and long bar.

As shown in FIG. 6, for example, a resin composition 44 in which quantum dots 46 are dispersed is injected into the metal molds 45 from the injection molding machine 41. The resin composition 44 is molten resin. The resin composition 44 in which the quantum dots 46 are dispersed is injected into the metal molds and then cooled to become solid, serving as a molding. The surface of a molding 40 removed from the metal molds 45 is ground to remove burrs or the like; thus obtaining the molding 40 having a desired size and a desired shape.

According to the method of producing the wavelength converting member 1, of this embodiment, the molding 40 can be freely formed into various shapes using the resin composition in which the quantum dots are dispersed.

Although an example of molding a resin molding by injection molding is described here, the molding 40 according to this embodiment may alternatively be formed using a method such as extrusion molding, blow molding, thermoforming, compression molding, calendaring, blown film extrusion, casting, or the like.

Next, as shown in FIG. 7, the formed molding 40 is inserted into the receiving space 5 of the receptacle 2 in the wavelength converting member 1 (the direction of the insertion is shown by the arrow in FIG. 7). Examples of the receptacle 2 include, for example, a glass capillary as described above. When the transverse cross section of the molding 40 shown in FIG. 7 (a cross section parallel to the plane denoted by reference numeral 42) is as large as or slightly larger than the transverse cross section of the receiving space 5, the molding 40 is inserted into the receiving space 5 while being pressed (press fit). Since the receptacle 2 is strong in the direction of the insertion of the molding 40, the receptacle 2 hardly suffers damage such as breaks in press fit. Press fit allows the molding 40 and the receptacle 2 to be tightly fixed to each other. On the other hand, when the area of the transverse cross section of the molding 40 shown in FIG. 7 is slightly smaller than that of the transverse cross section of the receiving space 5, the molding 40 is inserted into the receiving space 5 with an adhesive layer being applied to side surfaces of the molding 40. Fixing by bonding allows the molding 40 and the receptacle 2 to be tightly fixed to each other with an adhesive layer between.

Injecting the wavelength converting material into the receiving space 5 leads to a problem of air bubbles easily mixed in. In the wavelength converting member 1 according to this embodiment, since the wavelength converting material is formed from a molding, air bubbles can be prevented from being left in the wavelength converting material. In addition, the molding 3 containing the wavelength converting material can be brought into close contact with the receptacle 2, which can prevent gaps from being formed between the molding 3 of the wavelength converting material and the receptacle 2. Thus, the wavelength converting member 1 can be produced with high quality at high yield. Further, forming the wavelength converting material from a molding increases workability and facilitates quality control. Specifically, whether or not air bubbles are left in the molding 3 containing the wavelength converting material can be determined upon molding the molding 3 containing the wavelength converting material. If air bubbles are found in the molding 3 containing the wavelength converting material, the molding is rejected as a defective product and can be prevented from undergoing the step of insertion into the receiving space 5 of the receptacle 2. When air bubbles are not left in the molding 3 containing the wavelength converting material, the molding is subjected to the step of insertion into the receiving space 5 of the receptacle 2. When the wavelength converting material is introduced into the receiving space 5 of the receptacle 2 by resin injection, quality control is required after the injection, resulting in difficulty in determining whether air bubbles are contained in the wavelength converting material, and likely resulting in oversight. In this embodiment, quality control can easily be performed upon molding the molding 3 containing the wavelength converting material.

Figure 8:
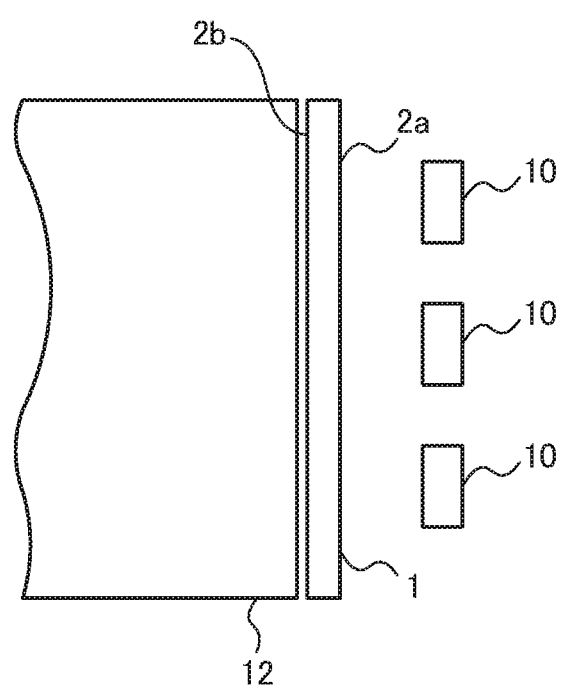
FIG. 8 is a plan view of a light emitting device and a light source unit using the wavelength converting member shown in FIGS. 1A and 1B.

FIG. 8 is a plan view of a light emitting device and a light source unit using the wavelength converting member shown in FIGS. 1A and 1B. The wavelength converting member 1 shown in FIGS. 1A and 1B can be provided between light emitting elements 10, for example, LEDs and a light guide plate 12 as shown in FIG. 8. The wavelength converting member 1 is placed on the light emission side of the light emitting elements 10. Here, the light emission side is the side where light is emitted from the light emitting elements 10. When the light emitting elements 10 have a structure in which LED chips are mounted on a printed wiring board, the light emission side is opposite to the LED chips with respect to the printed wiring board. Here, the wavelength converting member 1 and the light emitting elements 10 are assembled to form a light emitting device, and the light guide plate 12 is added to the light emitting device to form a light source unit. Alternatively, the wavelength converting member 1 and the light guide plate 12 can be assembled to form a light guide member. The light emitting device shown in FIG. 8 can be used, for example, as a white surface light source of a liquid crystal display.

With the structure shown in FIG. 8, light emitted from the light emitting elements 10 enters the light entrance plane 2a of the wavelength converting member 1 and undergoes wavelength conversion through the molding 3 containing the wavelength converting material (see FIGS. 1A and 1B), so that light having a desired wavelength exits the light exit plane 2b to be projected onto the light guide plate 12. The emitted light having a desired color is, for example, white light.

The colored layers 4 are provided as shown in FIGS. 2A to 2C and FIGS. 5A to 5D, etc., the ratio of light from the light source, the light emitting elements 10 that passes through side areas of the wavelength converting member 1 without undergoing wavelength conversion can be reduced. Accordingly, light having a desired color can be more effectively obtained from the light exit plane 2b.

Further, the occurrence of blackening can be suppressed with the structure in which the wall of the receptacle 2 is thicker on the light entrance plane 2a side when viewed from the molding 3 containing the wavelength converting material as shown in FIG. 4. FIG. 8 shows a configuration in which the wavelength converting member 1 is kept apart from the light emitting elements 10; however, even when for example the light emitting elements 10 abut the light entrance plane 2a of the wavelength converting member 1, the molding 3 containing the wavelength converting material can be kept at a distance from the light emitting elements 10 as shown in FIG. 4, and the occurrence of blackening can be effectively suppressed.

Figure 9:
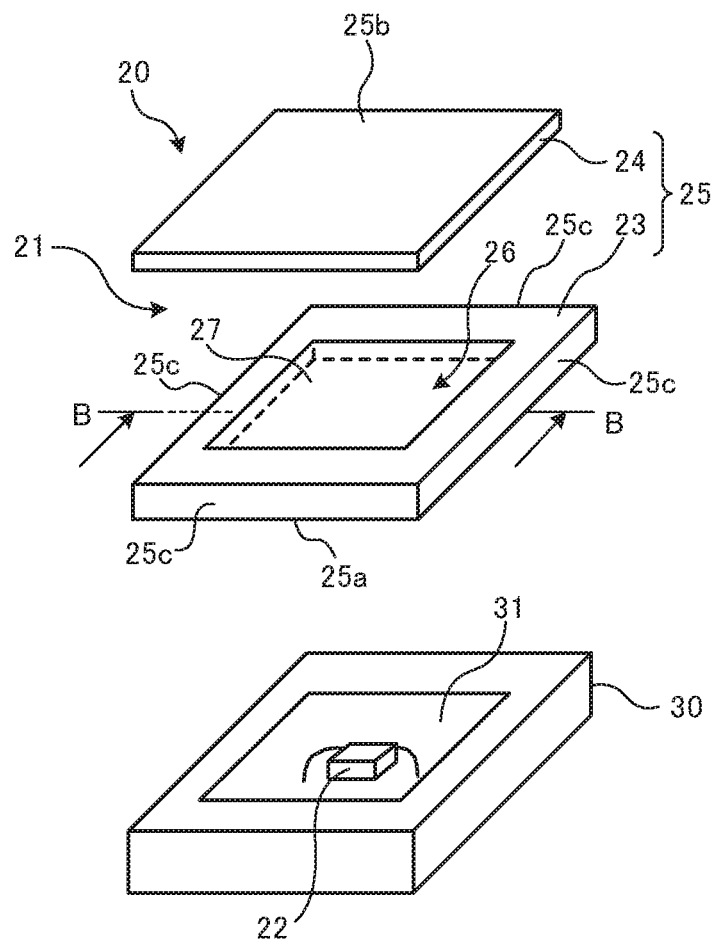
FIG. 9 is an exploded perspective view of a light emitting element exemplifying a second embodiment of the embodiments, provided with a wavelength converting member.
Figure 10:
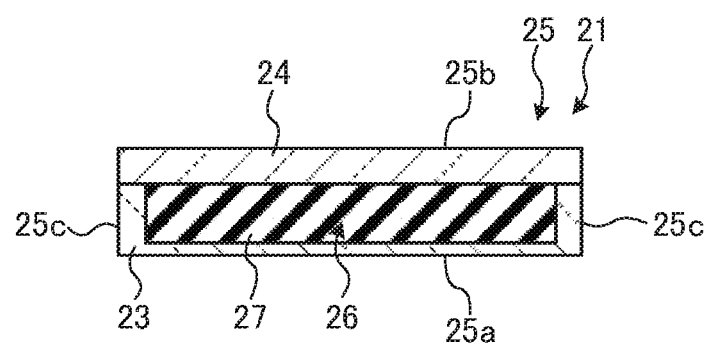
FIG. 10 is an enlarged longitudinal sectional view of the assembled wavelength converting member shown in FIG. 9, taken along line B-B in the height direction and viewed in the direction of the arrows.
Figure 11:
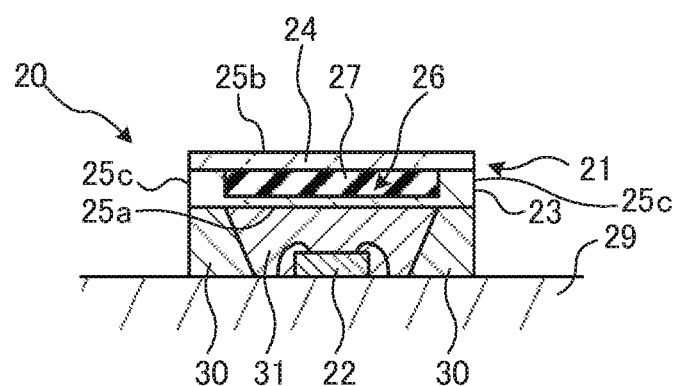
FIG. 11 is a longitudinal sectional view of the light emitting element shown in FIG. 9 with the members of the light emitting element shown in FIG. 9 having been assembled, taken along line B-B in the height direction and viewed in the direction of the arrows.

FIG. 9 is an exploded perspective view of a light emitting element exemplifying a second embodiment of the embodiments, provided with a wavelength converting member. FIG. 10 is an enlarged longitudinal sectional view of the assembled wavelength converting member shown in FIG. 9, taken along line B-B in the height direction and viewed in the direction of the arrows. FIG. 11 is a longitudinal sectional view of the light emitting element shown in FIG. 9 with the members of the light emitting element shown in FIG. 9 having been assembled, taken along line B-B in the height direction and viewed in the direction of the arrows.

A light emitting element 20 shown in FIG. 9 and FIG. 11 is configured to have a wavelength converting member 21 and an LED chip (light emitting chip) 22. The wavelength converting member 21 includes a receptacle 25 composed of more than one component, that is, a receptacle body 23 and a cover 24. The wavelength converting member 1 is placed on the light emission side of the LED chip (light emitting chip) 22. The light emission side here is opposite to the LED chip (light emitting chip) 22 with respect to a printed wiring board 29 of the light emitting element 20, that is, the side where light is emitted from the light emitting element 20. As shown in FIG. 9, FIG. 10, and FIG. 11, a receiving space 26 with a bottom thereunder is formed in the center of the receptacle body 23. A molding 27 containing a wavelength converting material is placed in the receiving space 26. The cover 24 is joined to the top of the receptacle body 23 with an adhesive layer, not shown, provided therebetween. Further, colored layers are formed on side surfaces 25c of the receptacle 25.

The lower surface of the receptacle 25 is a light entrance plane 25a of the wavelength converting member 21 shown in FIG. 9, FIG. 10, and FIG. 11. The upper surface opposite to the light entrance plane 25a is a light exit plane 25b.

The receiving space 26 is formed to be positioned inside the side surfaces 25c provided in the receptacle 25 of the wavelength converting member 21 shown in FIG. 9, FIG. 10, and FIG. 11. The molding 27 containing the wavelength converting material is placed in the receiving space 26 by fixing means such as press fit or bonding. Specifically, the molding 27 containing the wavelength converting material is molded to be slightly larger than the receiving space 26, and the molding 27 containing the wavelength converting material is press fit into the receiving space 26, thereby bringing the molding 27 containing the wavelength converting material into close contact with the receptacle 25. Alternatively, the molding 27 containing the wavelength converting material may be molded to be slightly smaller than the receiving space 26. On this occasion, the molding 27 containing the wavelength converting material is inserted into the receiving space 26 with an adhesive layer being applied to side surfaces of the molding 27 containing the wavelength converting material, thereby bringing the molding 27 containing the wavelength converting material into close contact with the receptacle 25. For the adhesive layer, the same resin as the molding 27, or a resin having the same basic structure as the resin can be used. Alternatively, a transparent adhesive member may be used as the adhesive layer.

As shown in FIG. 11, the LED chip 22 is connected to the printed wiring board 29 and the LED chip 22 is surrounded by a frame body 30 as shown in FIG. 9 and FIG. 11. The frame body 30 is filled with a resin layer 31.

As shown in FIG. 11, the wavelength converting member 21 is joined to the top of the frame body 30 with an adhesive layer, not shown, provided therebetween to form a light emitting element 20, for example, LEDs.

In the wavelength converting member 21 shown in FIG. 9, FIG. 10, and FIG. 11, the colored layers described with reference to FIGS. 2A to 2C, etc. may be provided; alternatively, as described with reference to FIG. 4, the wall of the receptacle may be thicker on the light entrance plane 25a side than on the light exit plane 25b side when viewed from the molding 27 containing the wavelength converting material.

Figure 12:
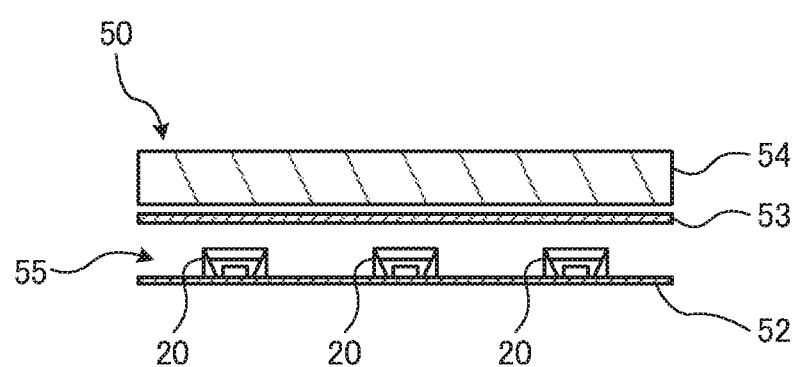
FIG. 12 is a longitudinal sectional view of a display device using the light emitting element shown in FIG. 9.

FIG. 12 is a longitudinal sectional view of a display device using the light emitting element shown in FIG. 9. As shown in FIG. 12, the display device 50 is configured to have a plurality of light emitting elements 20 (LEDs) and a display area 54 such as a liquid crystal display facing the light emitting elements 20. The light emitting elements 20 are placed on the back side of the display area 54.

The plurality of light emitting elements 20 are supported by a support body 52. The light emitting elements 20 are arranged at predetermined intervals. The light emitting elements 20 and the support body 52 constitute a back light 55 for the display area 54. The shape and the material of the support body 52 are not limited, and the support body 52 can be shaped, for example, like a sheet, a plate, or a case.

As shown in FIG. 12, a light diffusion plate 53, etc. are provided between the back light 55 and the display area 54.

A light source unit can be obtained by assembling the light emitting element 20 shown in FIG. 9 and FIG. 11 and the light guide plate 12 shown in FIG. 8. Alternatively, the light emitting device and the light source unit (including the light emitting element, the capillary wavelength converting member 1, the light guide plate 12, etc.) shown in FIG. 8 may be placed on the back side of the display area 54 shown in FIG. 12 (the light diffusion plate 53, etc. can be optionally provided therebetween) to form the display device 50.

Figure 13:
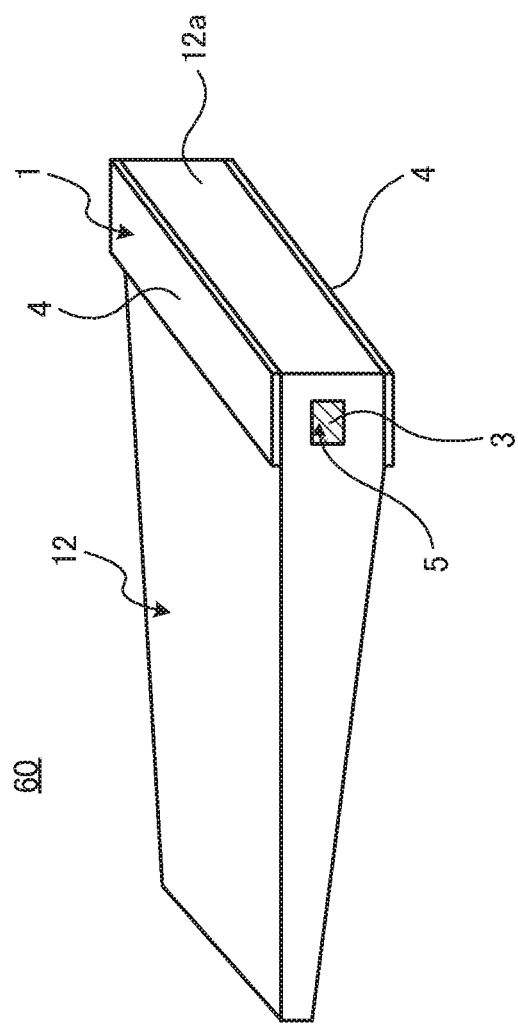
FIG. 13 is a perspective view illustrating a light guide member according to the embodiments.

Further, a light guide member 60 can be composed of the wavelength converting member 1 shown in FIG. 8 and the light guide plate 12 that are integrated. FIG. 13 is a perspective view illustrating a light guide member according to this embodiment. As shown in FIG. 13, the receiving space 5 is formed between both ends of the light guide plate 12 on the light entrance plane side, and the molding 3 containing the wavelength converting material is inserted into the receiving space 5. The structure of the molding 3 containing the wavelength converting material may be the same as that in FIGS. 1A and 1B, etc. In the embodiment shown in FIG. 13, since the wavelength converting member 1 is integrated with the light guide plate 12, a step for assembling the wavelength converting member 1 and the light guide plate 12 is rendered unnecessary, which can prevent problems such as misalignment or the like in the assembling step. Further, the number of components used to form the light guide member 60 can be reduced and the assembling step can be simplified, which leads to reduced production cost. Note that a light diffusion plate 53, etc. can be provided between the light guide plate 12 and the wavelength converting member 1. The colored layers 4 described with reference to FIGS. 2A to 2C, etc. may be provided in part of the wavelength converting member 1. In other words, the colored layers 4 are not provided on the surface functioning as the light guide plate 12. This can improve wavelength conversion efficiency and light guide efficiency.

Although not shown in FIG. 13, a light emitting element is placed to face the light entrance plane 12a of the light guide plate 12 (wavelength converting member 1).

Figure 14:
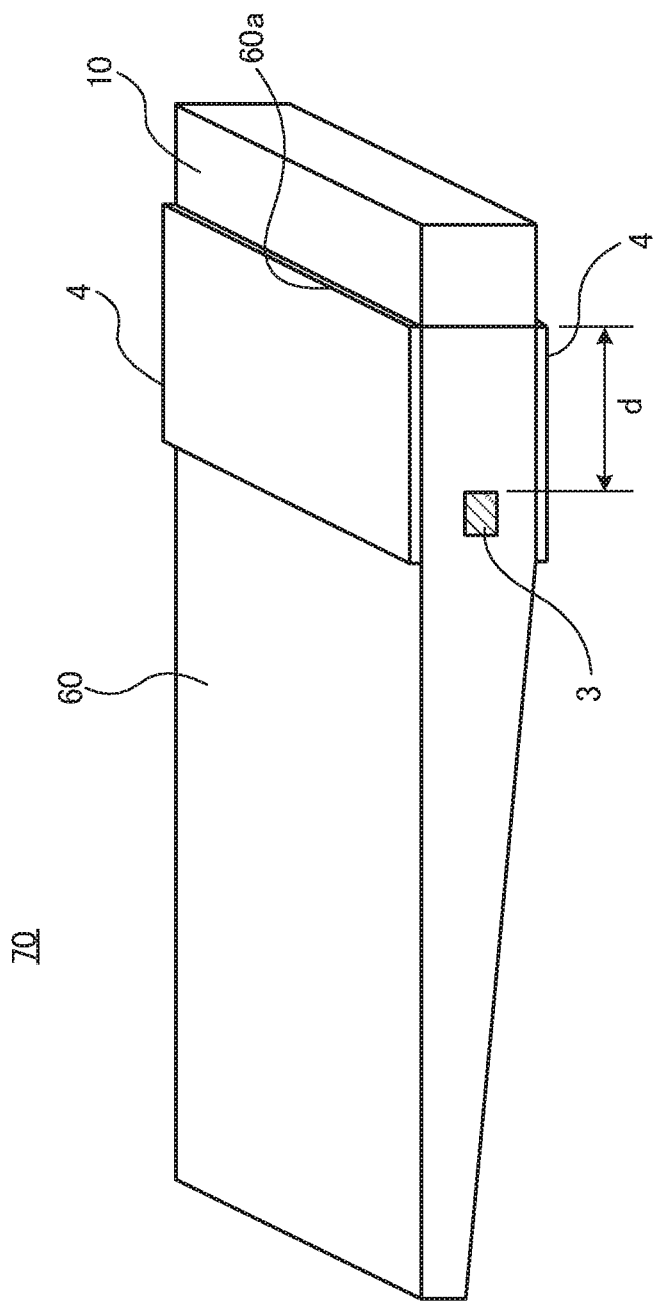
FIG. 14 is a perspective view illustrating a light source unit using the light guide member according to the embodiments.

Further, a light source unit 70 can be composed of the light guide member 60 shown in FIG. 13 and the light emitting element 10 that are integrated. FIG. 14 is a perspective view illustrating a light source unit using the light guide member according to this embodiment. As shown in FIG. 14, the light emitting element 10 is attached to a light entrance plane 60a of the light guide member 60. The light emitting element 10 has a structure in which a plurality of LED chips are arranged in parallel in a lateral direction in a frame body and are embedded in a resin. In another example, a plurality of light emitting elements 10 can be attached to the light entrance plane 60a of the light guide member 60. In FIG. 14, a distance d between the molding 3 containing the wavelength converting material and the light entrance plane 60a is made longer than in FIG. 13, so that the light emitting element 10 can be directly attached to the light entrance plane 60a. This allows the light emitting element 10 to be easily placed on the light guide member 60 and prevents the occurrence of blackening in the molding 3 containing the wavelength converting material. The distance d is preferably 1 mm to 8 mm as with the distance L1 shown in FIG. 4. The colored layers 4 are provided in the structure in FIG. 14 like in FIG. 13. Note however that the colored layers 4 are not necessarily formed in the structures shown in FIG. 13 and FIG. 14.

The light guide member 60 shown in FIG. 13, a light emitting element (not shown), and the light source unit 70 shown in FIG. 14 may be placed on the back side of the display area 54 shown in FIG. 12 (the light diffusion plate 53, etc. can optionally be provided) to form a display device 50. The wavelength converting member and the light emitting element of this embodiment can also be applied to other embodiments of a light source unit, a lighting system, a light diffusion apparatus, a light reflector system, and the like other than the light source unit or the display device described above.

INDUSTRIAL APPLICABILITY

In the present invention, LEDs, back light units, display devices, and the like can be realized using a wavelength converting member in which a molding formed from a wavelength converting material is press fit into a receptacle. In accordance with a wavelength converting member of the present invention, a molding containing a wavelength converting material can suitably be placed in the wavelength converting member, which allows LEDs, back light units, display devices, and the like using the wavelength converting member of the present invention to have high quality.

This application is based on Japanese patent application No. 2014-224053 filed on Nov. 4, 2014, the content of which is hereby incorporated in its entirety.

The invention claimed is:

1. A method of producing a wavelength converting member, the method comprising:
   obtaining an elongated bar-shaped molding that does not contain any internal air-bubbles therein, the molding provided with a plurality of types of quantum dots having different absorption wavelengths, the molding being formed as a resin composition in which the quantum dots are dispersed and having a shape that fits into an elongated receiving space of a receptacle; and
   inserting the molding into the elongated receiving space of the receptacle,
   wherein the elongated receiving space is defined by inner surfaces of a light entrance surface and a light exit surface of the receptacle, the elongated receiving space including an opening, and
   wherein the molding is inserted, while being press-fit, into the elongated receiving space via the opening, whereupon the molding and the receptacle are tightly fixed to each other such that no gaps remain between the molding and the receptacle.

* * * * *